(12) United States Patent
Zeng

(10) Patent No.: US 11,614,787 B2
(45) Date of Patent: Mar. 28, 2023

(54) CONTROL SYSTEM FOR TERMINAL DEVICE AND METHOD THEREOF

(71) Applicant: Shenzhen Chenbei Technology Co., Ltd., Shenzhen (CN)

(72) Inventor: Wei Zeng, Shenzhen (CN)

(73) Assignee: Shenzhen Chenbei Technology Co., Ltd., Shenzhen (CN)

( * ) Notice: Subject to any disclaimer, the term of this patent is extended or adjusted under 35 U.S.C. 154(b) by 298 days.

(21) Appl. No.: 16/996,757

(22) Filed: Aug. 18, 2020

(65) Prior Publication Data

US 2021/0055775 A1   Feb. 25, 2021

(30) Foreign Application Priority Data

Aug. 19, 2019   (CN) .......................... 201910763614.8

(51) Int. Cl.
*G06F 1/3212* (2019.01)
*G01R 31/382* (2019.01)
*G06F 1/3287* (2019.01)

(52) U.S. Cl.
CPC ......... *G06F 1/3212* (2013.01); *G01R 31/382* (2019.01); *G06F 1/3287* (2013.01)

(58) Field of Classification Search
CPC .... G06F 1/3212; G06F 1/3287; G06F 1/3231; G06F 1/3265; G01R 31/382; Y02D 10/00; G01D 21/02; G05B 19/04
See application file for complete search history.

(56) References Cited

U.S. PATENT DOCUMENTS

| | | | |
|---|---|---|---|
| 2008/0161946 A1* | 7/2008 | Kubota | H04Q 9/00 700/90 |
| 2014/0012791 A1* | 1/2014 | Grichnik | G06N 20/00 702/179 |
| 2014/0247206 A1* | 9/2014 | Grokop | G06F 1/3287 345/156 |
| 2014/0368688 A1* | 12/2014 | John Archibald | G06K 9/6218 348/222.1 |
| 2019/0274101 A1* | 9/2019 | Price | G06N 20/00 |
| 2021/0089108 A1* | 3/2021 | Iyer | G06F 1/3212 |

* cited by examiner

*Primary Examiner* — Jaweed A Abbaszadeh
*Assistant Examiner* — Brian J Corcoran
(74) *Attorney, Agent, or Firm* — Tsz Lung Yeung

(57) ABSTRACT

A control system for a terminal device includes a retrieval circuitry, a computing circuitry, a power circuitry, and a control circuitry. The retrieval circuitry is arranged to receive a plurality of electrical signals transmitted from a sensor of the terminal device. The electrical signals correspond to a first operational status thereof. The computing is arranged to determine a first variable value based on the electrical signals and a reference value. The power circuitry is arranged to retrieve a remaining power level of the terminal device, and determine a second variable value based on the remaining power level. The control circuitry is arranged to drive the terminal device to switch from the first operational status to the second operational status when the first variable value is greater than the second variable value.

14 Claims, 5 Drawing Sheets repetitively receiving electrical signals transmitted from a sensor 51 of the terminal device 90 for several predetermined time intervals, and determining a first variable value based on the electrical signals and an archived value

↓ retrieving a remaining power level of the terminal device 90, and determining a corresponding second variable value based on the remaining power level

↓ driving the terminal device 90 to switch from the first operational status to the second operational status when the first variable value is greater than the second variable value

Fig. 1

CONTROL SYSTEM FOR TERMINAL DEVICE AND METHOD THEREOF

CROSS REFERENCE TO RELATED APPLICATION

This is a non-provisional application which claims priority to a Chinese patent application having an application number of CN 201910763614.8, and a filing date of Aug. 19, 2019, the entire contents of which is hereby incorporated by reference.

BACKGROUND

Technical Field

Embodiments of the present disclosure relates to a control module, and more particularly to a control module for a terminal device and a method thereof which takes into account a remaining power level of the terminal device when determining a switching threshold of an operational status.

Description of Related Arts

A conventional terminal device, such as a computer monitor or a smart trash can, usually has at least two operational statues, an on mode or an off mode. For example, a computer monitor may be either in an on mode or an off mode and a smart trash may either be in an opened status or a closed status.

A conventional method for controlling the operational status of the terminal device may be accomplished through a sensor and/or transducer in order to accomplish automatic control. For example, when a sensor senses a particular physical property which is larger than a predetermined threshold, the sensor may generate an electrical signal which may activate switching of an operational status. The predetermined threshold may represent the minimum value of the detected electrical signals for switching operational status. This predetermined threshold may vary for different sensors/transducers because different sensors/transducers may have different sensitivities.

There are several disadvantages in association with the above-mentioned conventional control technology. First, the predetermined threshold for each sensor/transducer is determined based on a detection of each sensor by a wide variety of reference objects, and this way of determination may involve a substantial amount of manpower, material resources and financial resources, etc. This inevitably increases the cost of these terminal devices.

Moreover, since the switching of the operational status of the terminal device depends on a comparison between a detected physical property and a predetermined threshold, when electric supply to the sensor/transducer is inadequate or instable, such as when the corresponding terminal device is low in battery or power supply, the electrical signals may change abruptly and become very instable. Therefore, the electrical signals as detected by the sensor or transducer may also change abruptly and become very instable. This causes the switching of the operational status to be inaccurate.

As a result, there is a need to develop a control module for a terminal device which takes into consideration the remaining power level of the terminal device switching the operational statuses thereof.

SUMMARY

Implementations of the present disclosure provide a control system for a terminal device and a control method thereof which takes into account a remaining power level of the terminal device when determining a switching threshold of an operational status.

In one aspect of the present disclosure, it provides a control system for a terminal device having a sensor and being operated between at least a first operational status and a second operational status, the control system comprising:

a retrieval circuitry electrically connected to the terminal device, the retrieval circuitry being arranged to repetitively receive a plurality of electrical signals captured by the sensor, the electrical signals corresponding to the first operational status of the terminal device;

a computing circuitry electrically connected to the retrieval circuitry, the computing circuitry being arranged to determine a first variable value based on the electrical signals and a reference value;

a power circuitry electrically connected to the retrieval circuitry, the computing circuitry, and the terminal device, the power circuitry being arranged to retrieve a remaining power level of the terminal device, and determining a second variable value based on the remaining power level; and a control circuitry electrically connected to the power circuitry, the computing circuitry and the retrieval circuitry, the control circuitry being arranged to drive the terminal device to switch from the first operational status to the second operational status when the first variable value is greater than the second variable value.

In another aspect of the present disclosure, it provides a method of controlling a terminal device, comprising the steps of:

(a) repetitively receiving, by a retrieval circuitry, a plurality of electrical signals captured by a sensor of the terminal device for a predetermined time interval, the electrical signals corresponding to a first operational status of the terminal device;

(b) determining, by a computing circuitry, a first variable value based on the electrical signals and a reference value, the computing circuitry being electrically connecting to the retrieving circuitry;

(c) retrieving, by a power circuitry, a remaining power level of the terminal device, and determining a second variable value based on the remaining power level, the power circuitry being electrically connected to the terminal device, the computing circuitry and the retrieval circuitry; and (d) driving, by a control circuitry, the terminal device to switch from the first operational status to the second operational status when the first variable value is greater than the second variable value, the control circuitry being electrically connected to the terminal device, the power circuitry, the computing circuitry and the retrieval circuitry.

This summary presented above is provided merely to introduce certain concepts and not to identify any key or essential features of the claimed subject matter.

BRIEF DESCRIPTION OF THE DRAWINGS

FIG. 1 is a flowchart illustrating a method of controlling a terminal device according to a preferred embodiment of the present invention.

DETAILED DESCRIPTION OF THE PREFERRED EMBODIMENT

Figure 2:
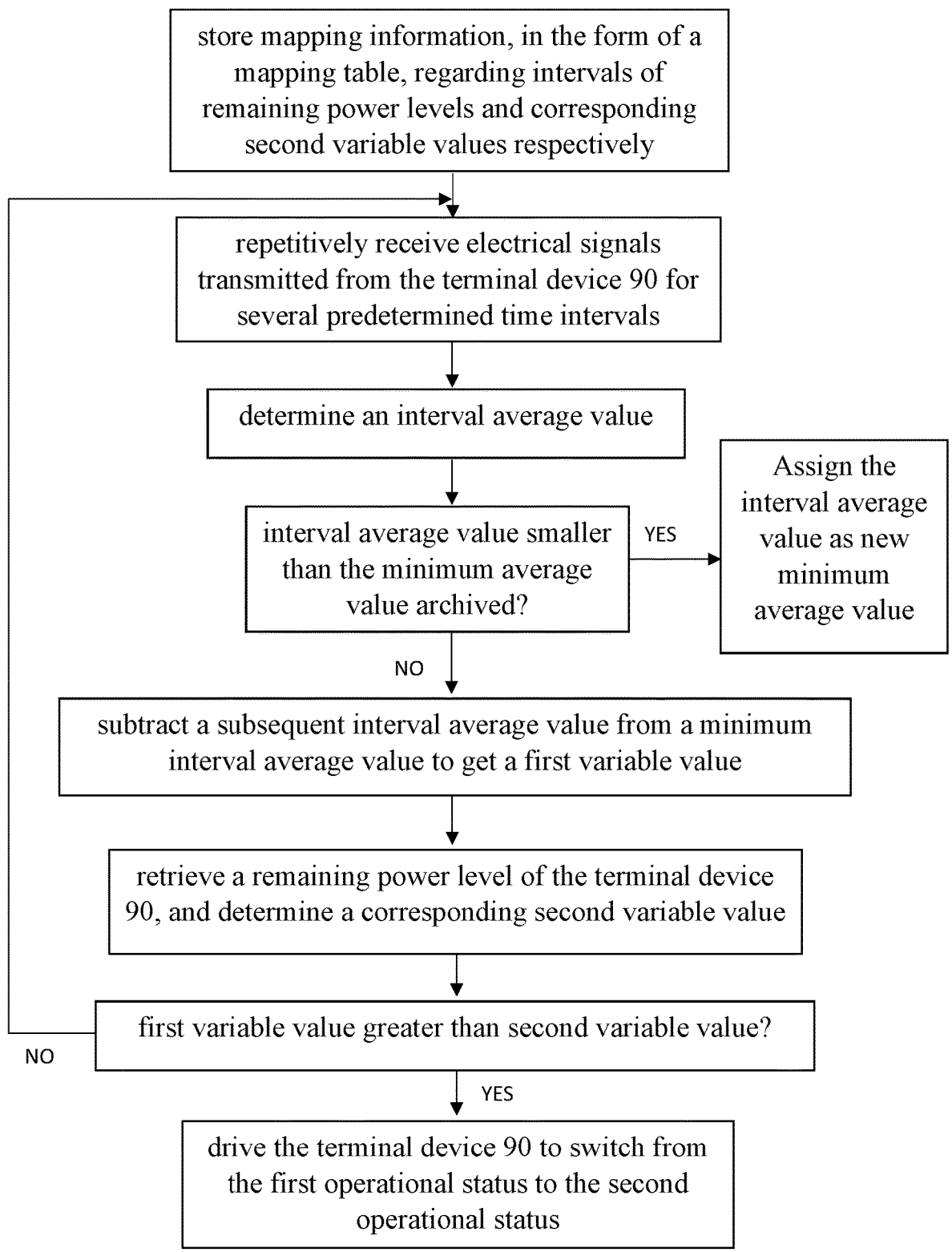
FIG. 2 is another flowchart illustrating a method of controlling a terminal device according to the preferred embodiment of the present invention.
Figure 3:
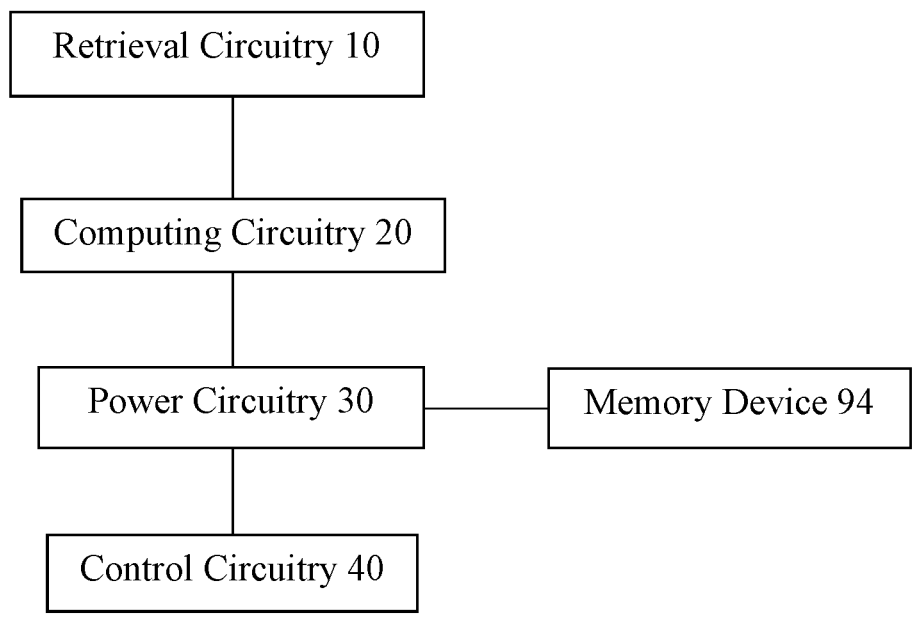
FIG. 3 is a block diagram of a control system for a terminal device according to a preferred embodiment of the present invention.
Figure 4:
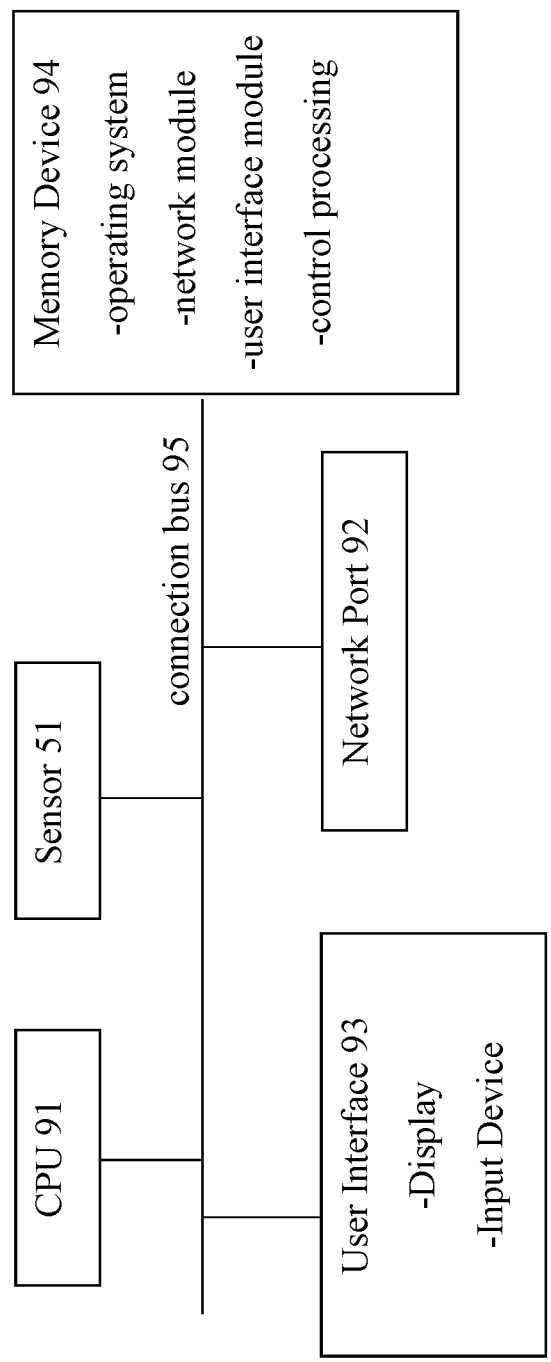
FIG. 4 is another block diagram of a control system for a terminal device according to the preferred embodiment of the present invention.

The following detailed description of the embodiments is the preferred mode of carrying out the present disclosure. The description is not to be taken in any limiting sense. It is presented for the purpose of illustrating the general principles of embodiments of the present disclosure.

It should be appreciated that the terms "install", "connect", "couple", and "mount" in the following description refer to the connecting relationship in the accompanying drawings for easy understanding of embodiments of the present disclosure. For example, the connection can refer to permanent connection or detachable connection. Furthermore, "connected" may also mean direct connection or indirect connection, or connection through other auxiliary components. Therefore, the above terms should not be an actual connection limitation of the elements of embodiments of the present disclosure.

It should be appreciated that the terms "length", "width", "top", "bottom", "front", "rear", "left", "right", "vertical", "horizontal", "upper", "lower", "exterior", and "interior" in the following description refer to the orientation or positioning relationship in the accompanying drawings for easy understanding of embodiments of the present disclosure without limiting the actual location or orientation of embodiments of the present disclosure. Therefore, the above terms should not be an actual location limitation of the elements of embodiments of the present disclosure.

It should be appreciated that the terms "first", "second", "one", "a", and "an" in the following description refer to "at least one" or "one or more" in the embodiment. In particular, the term "a" in one embodiment may refer to "one" while in another embodiment may refer to "more than one". Therefore, the above terms should not be an actual numerical limitation of the elements of embodiments of the present disclosure.

Referring to FIGS. 1 to 4 of the drawings, a method of controlling a terminal device 90 according to a preferred embodiment of the present invention is illustrated. The method may comprise the steps of:

(a) repetitively receiving, by a retrieval circuitry 10, a plurality of electrical signals captured by a sensor 51 of the terminal device 90 for a predetermined time interval, the electrical signals corresponding to a first operational status of the terminal device 90;

(b) determining, by a computing circuitry 20, a first variable value based on the electrical signals and an archived value, the computing circuitry 20 being electrically connecting to the retrieving circuitry 10;

(c) retrieving, by a power circuitry 30, a remaining power level of the terminal device 90, and determining a corresponding second variable value based on the remaining power level, the power circuitry 30 being electrically connected to the terminal device 90, the computing circuitry 20 and the retrieval circuitry 10; and (d) driving, by a control circuitry 40, the terminal device 90 to switch from the first operational status to the second operational status when the first variable value is greater than the second variable value, the control circuitry 40 being electrically connected to the terminal device 90, the power circuitry 30, the computing circuitry 20 and the retrieval circuitry 10.

It is worth mentioning that the above-mentioned method may be carried out by a combination of hardware or software. Thus, the above-mentioned method may be implemented in a software which may be installed in or downloaded to a terminal device. Alternatively, the terminal device may come with a built-in software which automatically carries out the above-described.

In this preferred embodiment, the above-mentioned method may be carried out by a control system comprising a retrieval circuitry 10, a computing circuitry 20, a power circuitry 30, and a control circuitry 40. The control system may be utilized for controlling a terminal device 90 having a sensor 51. The terminal device 90 may be selectively operated between a first operational status and a second operational status.

The terminal device 90 may comprise a central processing unit (CPU 91) for centrally processing information and driving the relevant electronic components to operate, a network port 92, a user interface 93 for communicating with a user of the terminal device 90, and at least one connection bus 95 for facilitating communication between electronic components of the terminal device 90. The user interface may comprise a display screen, an input device such as a keypad, or other user interactive devices. The network port 92 may be arranged to facilitate wired or wireless connection to internet or other networks.

The control system may further comprise a memory device 94 electrically connected to the power circuitry 30. The memory device 94 may be arranged to store information, such that information and record regarding remaining power level of the terminal device 90. The memory device 94 may be configured as RAM or any non-volatile memory, such as a hard drive.

The CPU 91 may be electrically connected to the retrieval circuitry 10, the computing circuitry 20, the power circuitry 30, the control circuitry 40, and the memory device 94 for centrally processing the information from these components.

The terminal device 90 may be an electrical appliance, such as a smart trash can, which may have at least two operational statuses, such as when the cover of the smart trash can is in on/off position. Another example is that the terminal device 90 may be embodied as a smart lock comprising a latch which may be controlled to move between a locked position and an unlocked position. The terminal device 90 may be controlled by the control system of the present invention to switch from a first operational status to a second operational status, or vice versa. The terminal device 90 may be operated by rechargeable battery so that the power level thereof may gradually deteriorate as the terminal device 90 is put in use.

In step (a), multiple electrical signals may be repetitively received by the retrieval circuitry 10 in a predetermined time interval. For example, the receiving circuitry 10 may be configured to receive twenty to thirty electrical signals per second. In this situation, the predetermined time interval is 1 second. The electrical signals may be voltage levels, currents, or other electrical attributes. In step (a), the terminal device 90 may be in the first operational status. The number of electrical signals received at a predetermined time interval may be designated as N, where N is an integer greater than 1. For example, the number of electrical signals received in one second as the predetermined interval may be 20, so that N may be equal to 20. The electrical signals may be in the form of voltage, current, or other electrical attributes.

Thus, the retrieval circuitry 10 may be electrically connected to the terminal device 90, the retrieval circuitry being arranged to repetitively receive a plurality of electrical signals captured by the sensor 51 at a predetermined time interval, wherein the electrical signals correspond to the first operational status of the terminal device 90.

Take a digital temperature and humidity meter with a digital display as an example of the terminal device 90, the first operational status may be configured as turning off the digital display, while the second operational status may be configured as turning on the digital display. The sensor 51 may be configured as a motion sensor which detects the presence of a human body. When a human body approaches the terminal device 90, the electrical signals generated by the sensor 51 change. When the first variable value is greater than the second variable value, the first operational status may be switched to the second operation status so that the digital display may now be turned on. Note that the electrical signal as detected by the sensor 51 is greater when a person is present, so that there exists a difference between electrical signals when the sensor 51 does not detect any people and when the sensor 51 detects a person is approaching. Moreover, turning off the digital display when no person is near the temperature and humidity meter may minimize energy consumption thereof. The method shown in FIG. 1 may also apply to control opening and closing of a smart trash can, and opening and closing of a smart toilet cover.

The method of controlling a terminal device 90 may further comprise a step of storing, by a memory device 94, mapping information (preferably in the form of a mapping table) between intervals of remaining power levels and corresponding second variable values respectively.

An exemplary mapping table may be shown in Table 1 below:

TABLE 1

| remaining power level interval | Second variable value (mv) |
|---|---|
| (25%, 50%] | 5 |
| (20%, 25%] | 6 |
| (10%, 20%] | 7 |
| (5%, 10%] | 8 |
| (0%, 5%] | 10 |

For example, the variable value of each interval of the remaining power level may be stored in the mapping table shown in Table 1. The mapping information in the form of the mapping table may be stored in the memory device 94. Each interval of the remaining power level may be assigned a corresponding variable value and this variable value may constitute the second variable value described in step (c) above. Since the performance of the terminal device 90 differs for different remaining power level, assigning each interval of remaining power level a unique second variable value may allow consistent and accurate switching from the first operational status to the second operational status.

Step (b) may comprise the steps of:

(b.1) for each of the time intervals, determining an average value of the electrical signals to generate an interval average value, each of the interval average values thus generated being recorded in the memory device 94;

(b.2) subtracting a subsequently determined interval average value from a minimum interval average value recorded in the memory device 94 to form the first variable value; and (b.3) replacing a recorded minimum interval average value with a subsequently determined interval average value when the subsequently determined interval average value is less than the recorded minimum interval average value.

In step (b.1) the average value of electrical signals for each time interval may be continuously determined and recorded. For example, if there exist 10 intervals (corresponding to ten 1 s-intervals), a total of 10 average values will be determined and recorded. A subsequently determined average value of the electrical signals (e.g. a time interval corresponding to 10th-11th second) will be used to compared with the minimum average value recorded for the ten 1 s-intervals. If the newly determined average value is greater than the minimum average value, a subtraction according to step (b.2) is performed to obtain the first variable value. If the newly determined average value is less than the minimum average value, a subtraction according to step (b.2) is performed to obtain the first variable value.

Thus, it is worth mentioning that the acquisition of the average value is a task which may be continuously performed along a predetermined timeline. In other words, the average values of electrical signals may be acquired one-by-one along the predetermined timeline. As a result, the first average value thus acquired will therefore become the minimum average value. Subsequently acquired average value will be compared with the first average value according to the manner described in steps (b.1) through step (b.3) above. Thus, the ultimate minimum average value which may be used for comparing with the subsequently determined average value may constitute the archived value stated in step (b) above.

Note that in a specific situation where N=1, the average value in this particular time interval is equal to the single electrical signal detected in this time interval.

From the above descriptions, one skilled in the art may appreciate that by taking average of the electrical signals, the influence of each individual electrical signals with respect to switching from the first operational status to the second operational status may be minimized, thus enhancing accuracy of the switching operation.

Thus, the computing circuitry 20 may be electrically connected to the retrieval circuitry 10. The computing circuitry 20 may be arranged to determine a first variable value based on the electrical signals and an archived value. The archived value may be obtained by the steps (b.1) to step (b.3) described above.

Step (c) may comprise the steps of:

(c.1) retrieving, by the power circuitry 30, a mapping table stored in the memory device 94, the mapping table storing information regarding a plurality of remaining power level intervals and corresponding second variable value;

(c.2) determining a remaining power level interval based on a real-time remaining power level of the terminal device 90; and (c.3) determining the corresponding second variable value based on the remaining power level interval contained in the mapping table.

Thus, the power circuitry 30 may be electrically connected to the retrieval circuitry 10, the computing circuitry 20, and the terminal device 90. The power circuitry may be arranged to retrieve a remaining power level of the terminal device 90, and determine a second variable value based on the remaining power level as stored in the mapping table. Accordingly, the power circuitry 30 may be electrically connected to the memory device 94 which may store and provide the mapping information regarding the remaining power level and the corresponding second variable value.

The power circuitry 30 and the memory device 94 may work together to form the second variable value. The second variable value may be determined by the remaining power level of the terminal device 90, wherein the remaining power level may be continuously detected and stored in the memory device 94. The information and record regarding remaining power level of the terminal device 90 as stored in the memory device 94 may form the basis of calculating the second variable value.

In step (d), the first variable value and the second variable value may be compared and if the first variable value is greater than the second variable value, the terminal device 90 may be switched from the first operational status to the second operational status. Thus, the control circuitry 40 may be electrically connected to the power circuitry 30, the computing circuitry 20 and the retrieval circuitry 10. The control circuitry may be arranged to drive the terminal device 90 to switch from the first operational status to the second operational status when the first variable value is greater than the second variable value.

The method of controlling a terminal device may further comprise a step (e) of re-executing step (a) through step (d) when the first variable value is less than the second variable value.

From the above description, it can be appreciated that by using the difference between the first variable value and the second variable value as a basis for determining whether or not a particular operational status should be switched, the impact of low power level on the part of the terminal device during the determination process can be minimized. Moreover, since the effects on the electrical signals for different remaining power levels are different, the present invention utilize different second variable values for different remaining power levels so as to enhance the accuracy of the switching operations. On the other hand, since the variations or instability of electrical signals for different remaining power levels are different, the present invention utilizes different variable values for different remaining power level intervals so as to maximize the accuracy of operational status of the terminal device. The sensor 51 does not need to use conventional methods or devices to ascertain predetermined threshold value. Moreover, the variable values are calculated by averaging values of electrical signals, this prevents any adverse effect bought by abrupt change in electrical value.

Figure 5:
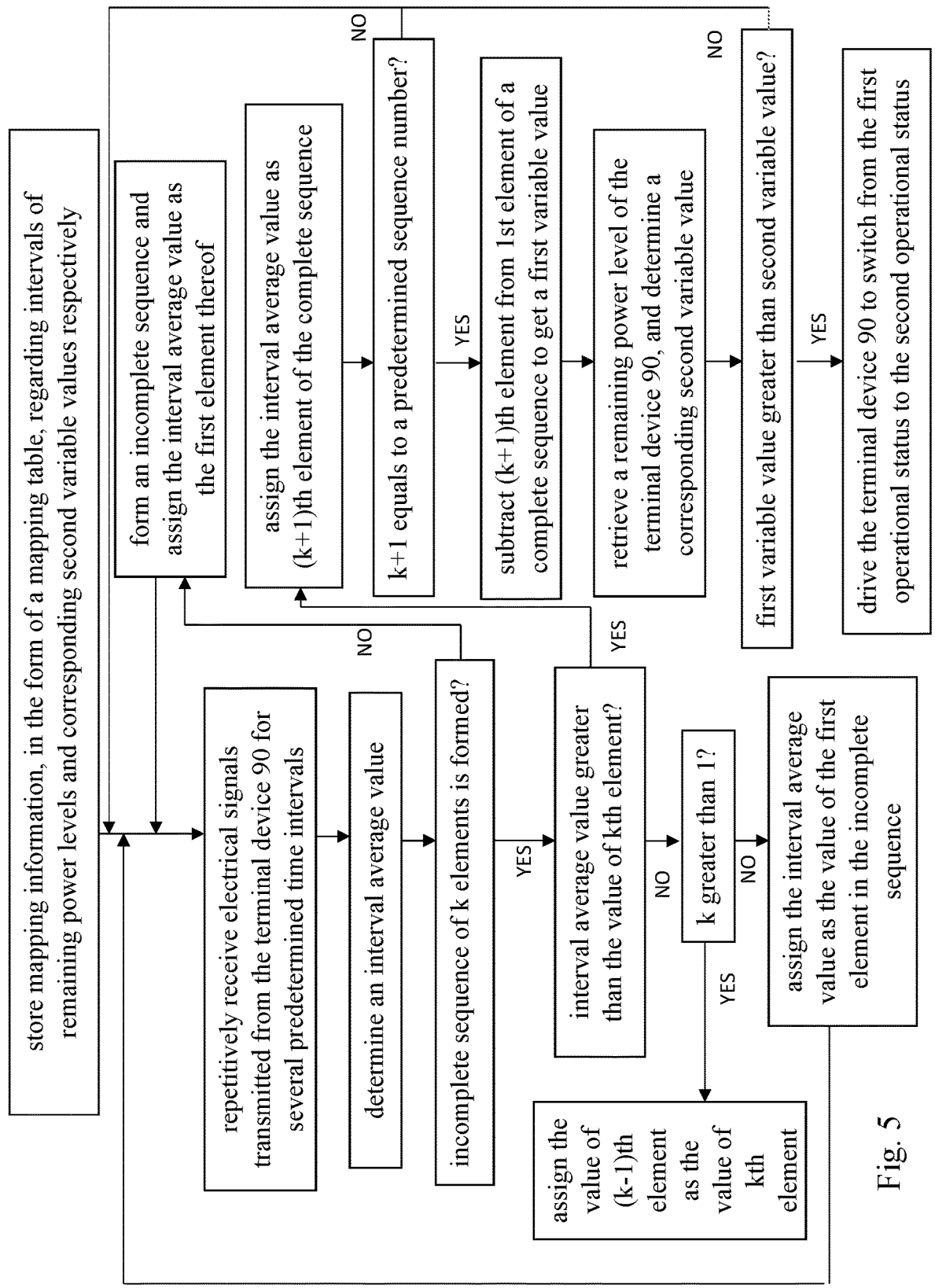
FIG. 5 is a flowchart illustrating a method of controlling a terminal device according to the alternative mode of the present invention.

Referring to FIG. 5 of the drawings, an alternative mode of the terminal device 90 according to the preferred embodiment of the present invention is illustrated. The alternative mode is similar to the preferred embodiment described above, except some detailed steps of controlling the terminal device 90.

According to the alternative mode, step (a) through step (d) as described above are identical. However, the exact algorithm of carrying out step (a) through step (e) may be modified. Thus, in step (a), multiple electrical signals may be repetitively received by the retrieval circuitry 10 in a predetermined time interval. For example, the receiving circuitry 10 may be configured to receive twenty to thirty electrical signals per second. In this situation, the predetermined time interval is 1 second. The electrical signals may be voltage levels, currents, or other electrical attributes. Again, in step (a), the terminal device 90 may be in the first operational status. The number of electrical signals received at a predetermined time interval may be designated as N, where N is an integer greater than 1. For example, the number of electrical signals received in one second as the predetermined interval may be 20, so that N may be equal to 20. The electrical signals may be in the form of voltage, current, or other electrical attributes.

The method of controlling a terminal device 90 in this alternative mode may also further comprise a step of storing, by a memory device 94, mapping information (preferably in the form of a mapping table) between intervals of remaining power levels and corresponding second variable values respectively. An exemplary mapping table may be shown in Table 1 above.

According to the alternative mode of the present invention, step (b) comprises the steps of:

(b.1') calculating an average value of N electrical signals for each successive predetermined time interval, where N is an integer greater than 1, wherein when N=1, designating the value of electrical signal when N=1 as an average value of N in the corresponding time interval;

(b.2') forming an incomplete sequence having k elements, the values of the incomplete sequence may correspond to the values of the average of the electrical signals received in step (b.1'), where k is an integer greater than 1 but smaller than or equal to a predetermined sequence number;

(b.3') assigning the average values of each predetermined time interval obtained in step (b.1') as one element of the incomplete sequence so as to expand the incomplete sequence until the incomplete sequence has altogether k elements to form a complete sequence, wherein all k elements of the incomplete sequence is arranged in ascending order; and (b.4') when k equals to the predetermined sequence number, assigning an average value of N electrical signals of a corresponding time interval as (k+1)th element of the sequence having a total of k+1 elements, and subtracting the value of (k+1)th element from a first element of the complete sequence to obtain the first variable value, wherein when k less than the predetermined sequence number, re-executing step (b.1') through step (b.3') to expand the incomplete sequence until k equals to the predetermined sequence number to form the complete sequence.

In other words, in step (b.4'), when the incomplete sequence is filled with the predetermined sequence number of the elements, assigning an average value of the electrical signals of an immediately subsequent time interval to the incomplete sequence to form a complete sequence having a total number of elements calculated by the predetermined sequence number plus one, and subtracting the last value of the element of the complete sequence from a first element of the complete sequence to obtain the first variable value.

In order to arrange all elements of the incomplete sequence in ascending order, step (b.3') may comprise the steps of:

(b.3'.1) for each of the average values determined in step (b.2'), when an average value of N electrical signals of a corresponding time interval is smaller than the value of kth element in the incomplete sequence, assigning the value of (k−1)th element to value of kth element in the incomplete sequence;

(b.3'.2) re-comparing each of the average values determined in step (b.2'), and re-executing step (b.3'.1) when an average value of N electrical signals of a corresponding time interval is still smaller than the value of kth element in the incomplete sequence; and (b.3'.3) assigning the average value of N electrical signals of a corresponding time interval as a first element of the incomplete sequence when k=1, and re-executing from step (b.1').

In other words, for each of the average value determined in step (b.2'), when the average value of the electrical signals of a corresponding time interval is smaller than the value of the corresponding element in the incomplete sequence, the these additional steps supersede the value of the last element of the incomplete sequence by the value of a second last element of the incomplete sequence.

Moreover, these steps assign the average value of the electrical signals of a corresponding time interval as a first element of the incomplete sequence when the number of elements in the incomplete sequence equals to 1.

The purpose of this step is to ensure that all the elements in the incomplete sequence is of ascending order. When a newly determined average value of electrical signals is smaller than that of kth element in the incomplete sequence, the value of the kth element will be the same as the (k−1)th element.

An illustration of the above described method may be illustrated as follows: suppose the predetermined sequence number n=5, and the incomplete sequence of average numbers includes elements {V1, V2, V3}, and V1<V2<V3. Suppose the average value of N electrical signals is A1.

If A1>V3, the method inserts A1 as the last element of the incomplete sequence so that the incomplete sequence becomes {V1, V2, V3, V4}, where V4=A1, and V1<V2<V3<V4. Since n=5, a new set of electrical signals will be obtained according to step (a) above and obtain a new average value of A2 and A2>V4. The incomplete sequence will be updated to {V1, V2, V3, V4, V5}, where V5=A2, and V1<V2<V3<V4<V5. Since n=5, the incomplete sequence will be designated as complete and the first variable value becomes V5−V1.

According to Table 1 above, if the remaining power level is 18%, the second variable value is 7 mV. As a result, if the first variable value is greater than 7 mV, the terminal device 90A will be switched to the second operational status. If the first variable value is not greater than 7 mV, the method goes back to step (a) and new set of electrical signals will be re-acquired for evaluation again according to the steps described above.

If A1≤V3, the incomplete sequence will be updated as {V1, V2}, and comparison will be made between A1 and V2. If A1>V2, the incomplete sequence will be updated to {V1, V2, V3}, where V3=A1 and V1<V2<V3. However, since the number of elements in this incomplete sequence is still less than 5, the method goes back to step (a) to acquire a new average on a new set of electrical signals. The process continues until the number of elements in the incomplete sequence is equal to the predetermined number n.

In the situation where a particular physical property (such as movement of a user toward the terminal device 90 in case of a motion sensor) the value of the average numbers along time intervals should be increasing, so that V1<V2<V3 so on and so forth. In the unlikely situation where the average values in the incomplete sequence is not in ascending order, the method of the present invention assigns the value of (k−1)th element to value of kth element in the incomplete sequence for ensuring that the average values in the incomplete sequence is in the ascending order.

Embodiments of the present disclosure, while illustrated and described in terms of disclosed embodiments and several alternatives, is not limited to the particular description contained in this specification. Additional alternative or equivalent components could also be used to practice embodiments of the present disclosure.

What is claimed is:

1. A method of controlling a terminal device, comprising the steps of:
   (a) repetitively receiving, by a retrieval circuitry, a plurality of electrical signals captured by a sensor of said terminal device for a predetermined successive time interval, said electrical signals corresponding to a first operational status of said terminal device;
   (b) determining, by a computing circuitry, a first variable value based on said electrical signals and a reference value, said computing circuitry being electrically connecting to said retrieving circuitry;
   (c) retrieving, by a power circuitry, a remaining power level of said terminal device, and determining a second variable value based on said remaining power level, said power circuitry being electrically connected to said terminal device, said computing circuitry and said retrieval circuitry;
   (d) driving, by a control circuitry, said terminal device to switch from said first operational status to said second operational status when said first variable value is greater than said second variable value, said control circuitry being electrically connected to said terminal device, said power circuitry, said computing circuitry and said retrieval circuitry; and
   (e) storing, by a memory device, mapping information between intervals of remaining power levels and corresponding second variable values respectively, said mapping information includes intervals of remaining power level of said terminal device and corresponding second variable values,
   wherein in said step (a), said electrical signals are repetitively received by said retrieval circuitry for successive predetermined time intervals,
   wherein said step (b) comprises the steps of:
   (b.1) for each of said predetermined time intervals, determining an average value of said electrical signals to generate an interval average value, each of said interval average values thus generated being recorded in said memory device;
   (b.2) subtracting a subsequently determined interval average value from a minimum interval average value recorded in said memory device to form said first variable value; and
   (b.3) replacing said recorded minimum interval average value with said subsequently determined interval average value when said subsequently determined interval average value is less than said recorded minimum interval average value.

2. The method, as recited in claim 1, wherein in said step (b.1), said average value of electrical signals for each successive time interval is continuously determined and recorded as archived value.

3. The method, as recited in claim 2, wherein said step (b) comprises the steps of assigning said average value acquired as said minimum average value, and comparing subsequently acquired average values with said first average value according to said step (b.1) through said step (b.3).

4. The method, as recited in claim 3, wherein said step (c) comprises the steps of:
   (c.1) retrieving, by said power circuitry, a mapping table stored in said memory device, said mapping table storing information regarding a plurality of remaining power level intervals and corresponding second variable value;
   (c.2) determining a remaining power level interval based on a real-time remaining power level of said terminal device; and (c.3) determining said corresponding second variable value based on said remaining power level interval contained in said mapping table.

5. The method, as recited in claim 4, further comprising a step of re-executing said step (a) through said step (d) when said first variable value is less than said second variable value.

6. A method of controlling a terminal device, comprising the steps of:
  (a) repetitively receiving, by a retrieval circuitry, a plurality of electrical signals captured by a sensor of said terminal device for a predetermined successive time interval, said electrical signals corresponding to a first operational status of said terminal device;
  (b) determining, by a computing circuitry, a first variable value based on said electrical signals and a reference value, said computing circuitry being electrically connecting to said retrieving circuitry;
  (c) retrieving, by a power circuitry, a remaining power level of said terminal device, and determining a second variable value based on said remaining power level, said power circuitry being electrically connected to said terminal device, said computing circuitry and said retrieval circuitry; and
  (d) driving, by a control circuitry, said terminal device to switch from said first operational status to said second operational status when said first variable value is greater than said second variable value, said control circuitry being electrically connected to said terminal device, said power circuitry, said computing circuitry and said retrieval circuitry; and
  (e) storing, by a memory device, mapping information between intervals of remaining power levels and corresponding second variable values respectively, said mapping information includes intervals of remaining power level of said terminal device and corresponding second variable values,
  wherein in said step (a), said electrical signals are repetitively received by said retrieval circuitry for successive predetermined time intervals,
  wherein said step (b) comprises the steps of:
  (b.1') calculating an average value of said electrical signals for each successive predetermined time interval;
  (b.2') forming an incomplete sequence having a predetermined sequence number of elements;
  (b.3') assigning said average value of each predetermined time interval obtained in step (b.1') as one element of said incomplete sequence so as to expand said incomplete sequence until said incomplete sequence has said predetermined sequence number of elements to form a complete sequence, said all elements of said incomplete sequence are arranged in ascending order; and
  (b.4') when said incomplete sequence is filled with said predetermined sequence number of said elements, assigning an average value of said electrical signals of an immediately subsequent time interval to said complete sequence having a total number of elements calculated by said predetermined sequence number plus one, and subtracting last value of said element of said complete sequence from a first element of said complete sequence to obtain said first variable value.

7. The method, as recited in claim 6, wherein said step (b.3') comprises the steps of:
  (b.3'.1) for each of said average values determined in said step (b.2'), when said average value of said electrical signals of said corresponding time interval is smaller than a last element in said incomplete sequence, superseding a value of a second last element to said value of said last element in said incomplete sequence;
  (b.3'.2) re-comparing each of said average values determined in said step (b.2'), and re-executing said step (b.3'.1) when an average value of said electrical signals of a corresponding time interval is still smaller than said value of said last element in said incomplete sequence; and
  (b.3'.3) assigning said average value of said electrical signals of a corresponding time interval as a first element of said incomplete sequence when a number of said element in said incomplete sequence is equal to one, and re-executing from said step (b.1').

8. The method, as recited in claim 7, wherein said step (c) comprises the steps of:
  (c.1) retrieving, by said power circuitry, a mapping table stored in said memory device, said mapping table storing information regarding a plurality of remaining power level intervals and corresponding second variable value;
  (c.2) determining a remaining power level interval based on a real-time remaining power level of said terminal device; and
  (c.3) determining said corresponding second variable value based on said remaining power level interval contained in said mapping table.

9. The method, as recited in claim 8, further comprising a step of re-executing said step (a) through said step (d) when said first variable value is less than said second variable value.

10. A control system for a terminal device having a sensor and being operated between at least a first operational status and a second operational status, said control system comprising:
  a retrieval circuitry electrically connected to said terminal device, said retrieval circuitry being arranged to receive a plurality of electrical signals captured by said sensor, said electrical signals corresponding to said first operational status of said terminal device, said retrieval circuitry being configured to repetitively receive said electrical signals in successive predetermined time intervals;
  a computing circuitry electrically connected to said retrieval circuitry, said computing circuitry being arranged to determine a first variable value based on said electrical signals and a reference value;
  a power circuitry electrically connected to said retrieval circuitry, said computing circuitry, and said terminal device, said power circuitry being arranged to retrieve a remaining power level of said terminal device, and determine a second variable value based on said remaining power level;
  a control circuitry electrically connected to said power circuitry, said computing circuitry and said retrieval circuitry, said control circuitry being arranged to drive said terminal device to switch from said first operational status to said second operational status when said first variable value is greater than said second variable value; and
  a memory device arranged to store mapping information, said mapping information includes intervals of remaining power level of said terminal device and corresponding second variable values,
  said computing circuitry being configured to determine an average value of said electrical signals for each of said predetermined time intervals to generate an interval average value, subtract a subsequently determined interval average value from a minimum interval average value recorded in said memory device to form said first variable value, and replace said recorded minimum interval average value with said subsequently determined interval average value when said subsequently determined interval average value is less than said recorded minimum interval average value, said average value of electrical signals for each successive time interval being continuously determined and recorded as said archived value.

11. The control system, as recited in claim 10, wherein said power circuitry is configured to retrieve said mapping table stored in said memory device, determine a remaining power level interval based on a real-time remaining power level of said terminal device, and determine said corresponding second variable value based on said remaining power level interval contained in said mapping table.

12. The control system, as recited in claim 11, wherein said computing circuitry is configured to calculate an average value of said electrical signals for each successive predetermined time interval, form an incomplete sequence having a predetermined sequence number of elements, assign said average value of each predetermined time interval as one element of said incomplete sequence so as to expand said incomplete sequence until said incomplete sequence has said predetermined sequence number of elements, when said incomplete sequence is filled with said predetermined sequence number of said elements, assign an average value of said electrical signals of an immediately subsequent time interval to said incomplete sequence to form a complete sequence having a total number of elements calculated by said predetermined sequence number plus one, and subtracting said last value of said element of said complete sequence from a first element of said complete sequence to obtain said first variable value, said all elements of said incomplete sequence are arranged in ascending order.

13. The control system, as recited in claim 12, wherein said computing circuitry is configured such that for each of said average value previously determined, when said average value of said electrical signals of a corresponding time interval is smaller than said value of said corresponding element in said incomplete sequence, supersede said value of a last element of said incomplete sequence by said value of a second last element of said incomplete sequence, and assign said average value of said electrical signals of a corresponding time interval as a first element of said incomplete sequence when said number of element in said incomplete sequence equals to one.

14. The control system, as recited in claim 13, wherein said wherein said power circuitry is configured to retrieve said mapping table stored in said memory device, determine a remaining power level interval based on a real-time remaining power level of said terminal device, and determine said corresponding second variable value based on said remaining power level interval contained in said mapping table.

* * * * *